(12) United States Patent
Chung et al.

(10) Patent No.: US 9,543,943 B2
(45) Date of Patent: Jan. 10, 2017

(54) DIGITAL CIRCUIT

(71) Applicant: MEDIATEK INC., Hsin-Chu (TW)

(72) Inventors: Yuan-Hung Chung, Hsinchu County (TW); Jiunn-Nan Hwang, Hsinchu County (TW); Yipin Wu, Singapore (SG); Tsung-Ying Tsai, Hsinchu County (TW); Chin-Wei Huang, Hsinchu (TW)

(73) Assignee: MEDIATEK INC., Hsin-Chu (TW)

( * ) Notice: Subject to any disclaimer, the term of this patent is extended or adjusted under 35 U.S.C. 154(b) by 232 days.

(21) Appl. No.: 14/468,345

(22) Filed: Aug. 26, 2014

(65) Prior Publication Data

US 2016/0065182 A1     Mar. 3, 2016

(51) Int. Cl.
*H03K 5/00* (2006.01)
*H03K 17/687* (2006.01)
*H03K 19/003* (2006.01)
*H03K 17/16* (2006.01)
*H03H 11/04* (2006.01)

(52) U.S. Cl.
CPC .......... *H03K 17/687* (2013.01); *H03K 17/164* (2013.01); *H03K 19/00346* (2013.01); *H03H 11/0422* (2013.01)

(58) Field of Classification Search
CPC .............. G05F 1/565; G06F 1/28; G06F 1/30; H03K 3/012; H03K 17/687; H03H 7/0153; H03H 7/06
USPC . 327/540–544, 551–559, 336–337; 323/241, 283, 322
See application file for complete search history.

(56) References Cited

U.S. PATENT DOCUMENTS

| | | | |
|---|---|---|---|
| 7,214,910 B2* | 5/2007 | Chen ................... | G05D 23/1931 219/485 |
| 2014/0266118 A1* | 9/2014 | Chern ................... | H02M 3/156 323/283 |

* cited by examiner

*Primary Examiner* — Dinh T Le
(74) *Attorney, Agent, or Firm* — Winston Hsu; Scott Margo

(57) ABSTRACT

A digital circuit comprises a plurality of functional circuits and a finite state machine. Each functional circuit comprises a digital macro, a resistance control device and at least one device with capacitance. The digital macro is coupled to a ground. The resistance control device is electrically connected between the digital macro and an always-on power mesh. The at least one device with capacitance is electrically connected between the resistance control device and the ground. The finite state machine is electrically connected to the resistance control device, and is configured to adjust the resistance of the resistance control device.

11 Claims, 4 Drawing Sheets

DIGITAL CIRCUIT

BACKGROUND

Due to the limitations of chip area and power consumption, a mobile device may tend to adopt a digital circuit that integrates all components of a computer or other functional circuits into a single chip. The digital circuit may also comprise power switches to divide the functional circuits into several different power islands. The power supplies of the power islands are independent of each other. Namely, each of the functional circuits in the digital circuit is connected to the power supply through its power switches so the connection between the power supply and a functional circuit can be shut down by turning off the power switches when the functional circuit is idle. Thus, the power island divisions can help the digital circuit to save power consumption.

As the operation frequency of the mobile device increases, the functional circuits in the mobile device may influence each other, especially functional circuits that are processing radio-frequency (RF) signals, including a global positioning system (GPS), wireless fidelity (Wi-Fi), Bluetooth (BT) and frequency modulation (FM). These radio-frequency functions involve high frequency analog signals and high speed digital operations that consume huge digital currents and induce lots of switching noises. The high frequency spurs generated by the switching noises may fall into the interested RF band and couple to the RF receivers through the package or substrate causing sensitivity degradation of the RF receivers. The sensitivity degradation may get even worse when the chip size becomes smaller and the digital current becomes larger.

To reduce the mutual influences between the functional circuits, including the sensitivity degradations on functional circuits processing RF signals, extra circuits may be required to compensate the high frequency spurs. However, it could be very difficult to further embed more circuits into the digital circuit since the chip size has been strictly limited for mobile devices. Also, the current consumed by the functional circuits may vary with different operational modes so the high frequency spurs may also be changed, which makes it even harder to solve the issue of sensitivity degradation for functional circuits processing RF signals. Therefore, a solution without increasing the chip area is needed.

SUMMARY

One embodiment of the present invention discloses a digital circuit. The digital circuit comprises a plurality of functional circuits, and a finite state machine. Each functional circuit comprises a digital macro, a resistance control device, and at least one device with capacitance. The digital macro is coupled to a ground. The resistance control device is electrically connected between the digital macro and an always-on power mesh. The device with capacitance is electrically connected between the resistance control device and the ground. The finite state machine is electrically connected to the resistance control device, and configured to adjust the resistance of the resistance control device.

According to the embodiment of the present invention, the high frequency spurs generated by the operations of the functional circuits can be reduced according to different operational modes without adding extra circuits to the digital circuit.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
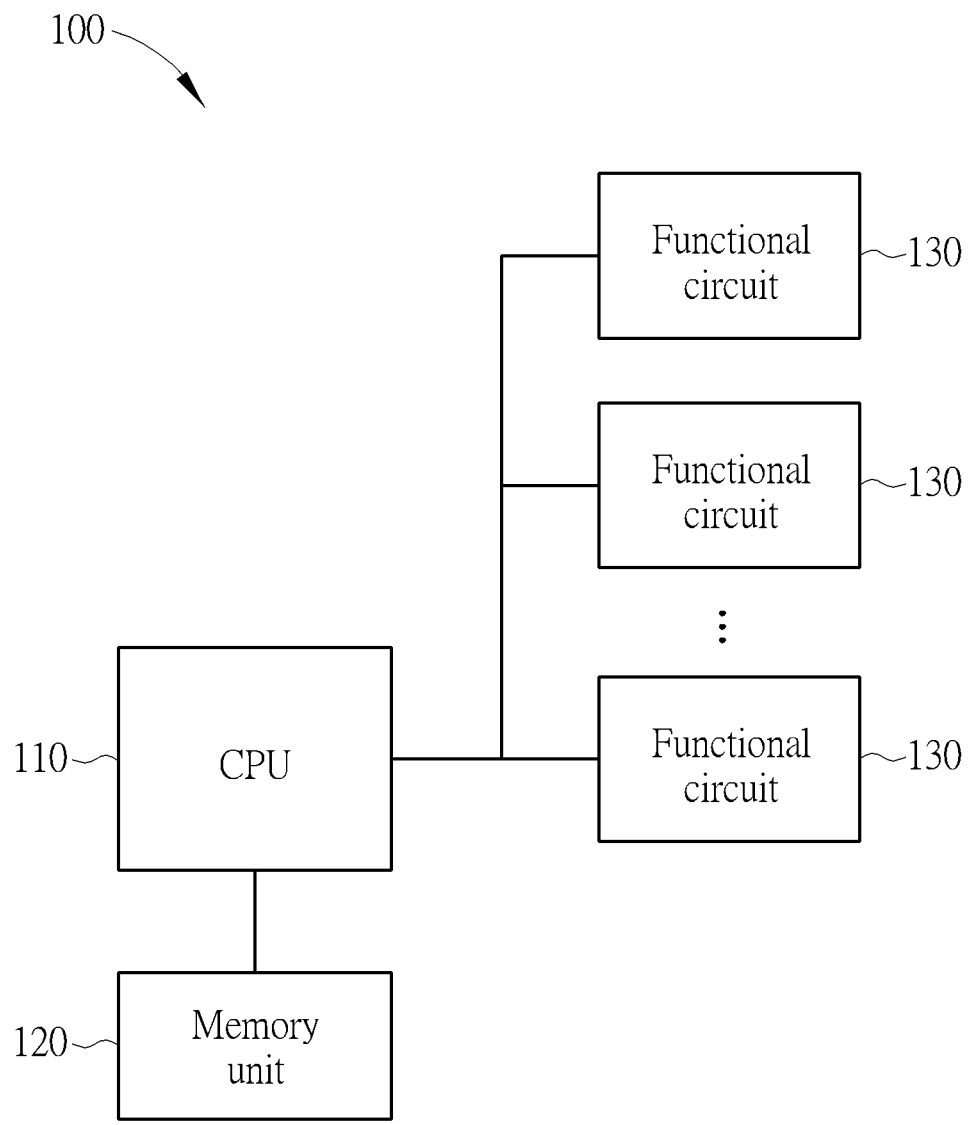
FIG. 1 shows a digital circuit according to one embodiment of the present invention.

FIG. 1 shows a digital circuit 100 according to one embodiment of the present invention. The digital circuit 100 comprises a CPU 110, a memory unit 120, and functional circuits 130. If the digital circuit 100 is operated in a mobile electronic device, the CPU 110 may be configured to deal with user requests by controlling the memory unit 120 and the functional circuits 130. The memory unit 120 can be used to store program instructions for different requests. The functional circuits 130 can be used to process multi-media related computations, different RF signals, such as to/from a global positioning system (GPS), wireless fidelity (Wi-Fi), Bluetooth (BT) and frequency modulation (FM), or any other computations depending on the system needs.

Figure 2:
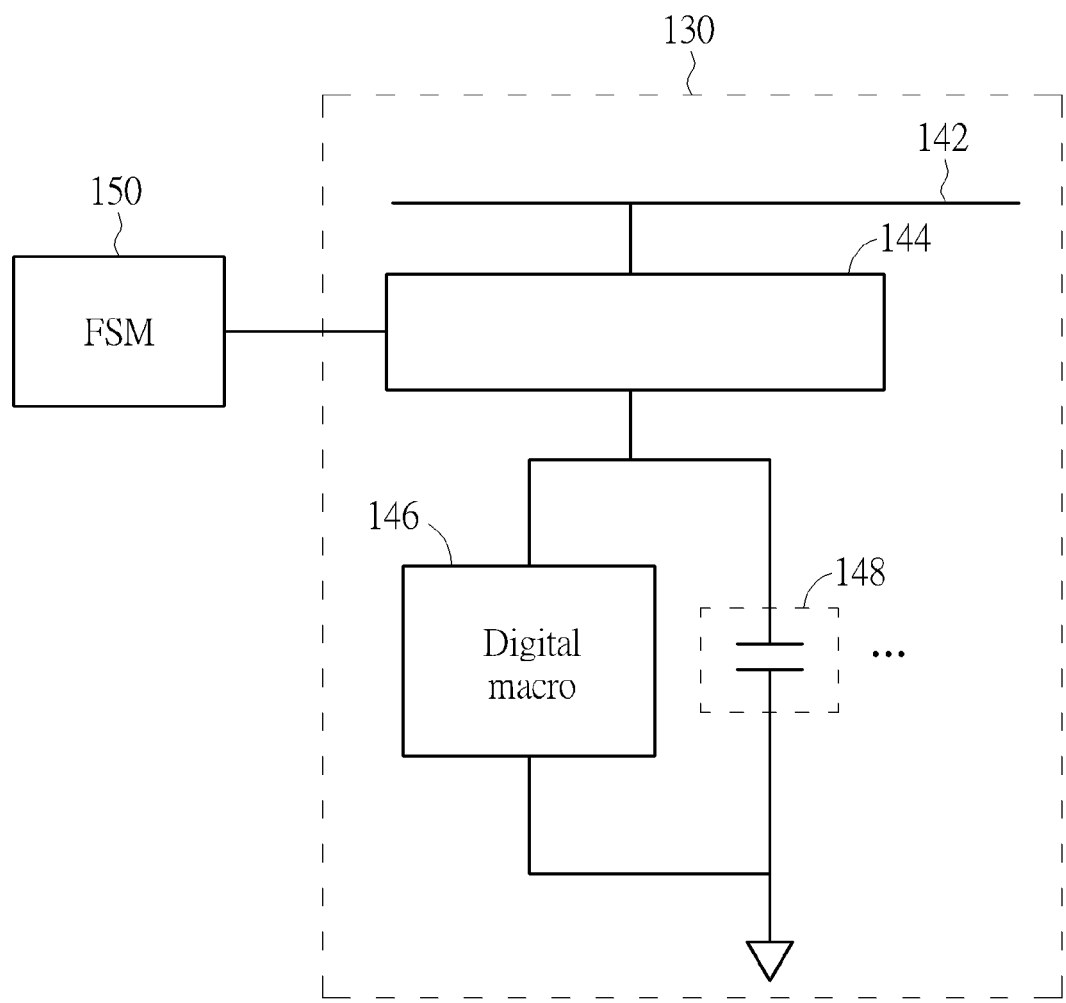
FIG. 2 shows a functional circuit of the digital circuit in FIG. 1 according to one embodiment of the present invention.

FIG. 2 shows the structure of the functional circuit 130 of the digital circuit 100 in FIG. 1 according to one embodiment of the present invention. In FIG. 2, the functional circuit 130 comprises an always-on power mesh 142, a digital macro 146, a resistance control device 144, and a device with capacitance 148. The always-on power mesh 142 is to provide the power supply to the functional circuit 130. The digital macro 146 is coupled to the ground. The digital macro 146 can be configured to process the required computations. For example, if the functional circuit 130 is used to process the RF signals, the digital macro 146 may derive the information carried by the RF signals, and to further perform operations corresponding to the information and the RF signals. The functional circuit 130 in the digital circuit 100 may correspond to different frequencies. For example, a functional circuit configured to process BT signals may have its corresponding frequencies centered at 2.4 GHz while a functional circuit configured to process FM signals may have its corresponding frequencies centered at 80 MHz. Thus, the digital macro 146 can be configured to process the RF signals with corresponding frequencies and to perform the corresponding operations.

The resistance control device 144 is electrically connected between the digital macro 146 and the always-on power mesh 142, that is, the resistance control device 144 can control the connection between the power supply and the digital macro 146. The device with capacitance 148 is electrically connected between the resistance control device 144 and the ground. The resistance control device 144 of each of the functional circuit 130 is controlled by a finite state machine 150. The finite state machine 150 is electrically connected to the resistance control device 144, and can be configured to adjust the resistance of the resistance control device 144 according to the operation frequencies of the digital macro 146 and a workload of the operations performed by the digital macro 146. In one embodiment of the present invention, the finite state machine 150 can be implemented by the CPU 110 in the digital circuit 100 or an existing functional circuit 130 so that no extra circuit is needed to control the resistance control device.

In one embodiment, the resistance control device 144 can be variable resistor so the finite state machine 150 can easily adjust the resistance of the resistance control device 144 by controlling the variable resistor. In another embodiment, the resistance control device 144 may comprises a plurality of power switches used to control the power supply to the digital macro 146 for the purpose of power saving. Namely, if the digital macro 146 is idle and no computation is required, the digital macro 146 can be shut down by turning off all the power switches of the resistance control device 144 to save the power consumption of the system. Since the power switches can also be seen as an equivalent resistor connected between the digital macro 146 and the always-on power mesh 142, the leakage current of the digital macro 146 may go out of the functional circuit 130 to other circuits in the digital circuit 100 through the resistance control device 144, which may cause high frequency spurs to other functional circuits 130 in the digital circuit 100. However, there are also bypassing paths provided by the device with capacitance 148 from the digital macro 146 to the ground. That is the equivalent resistor of the power switches of the resistance control device 144 and the device with capacitance 148 can form a resistor-capacitor filter (RC filter) connected to the digital macro 146.

The finite state machine 150 can adjust the equivalent resistance of the resistance control device 144 by turning off or on a selected number of the power switches of the resistance control device 144 so the frequencies to be filtered by the RC filter can also be adjusted. Namely, the more power switches turned on, the less the equivalent resistance of the resistance control device 144. Therefore, to reduce the leakage current of the digital macro 146 going into other functional circuits 130 in the digital circuit 100, the frequency to be filtered by the RC filter can be adjusted to be the same as or near enough to the operation frequencies of the functional circuit 130 so the leakage current of the digital macro 146 will bypass through the device with capacitance 148 to the ground without interfering the other functional circuits 130 in the digital circuit 100.

Since the current leakage of the digital macro 146 can be simulated under different operational modes by mathematic models, the finite state machine 150 can be configured to turn on or turn off the selected number of power switches according to the leakage current simulation result in one embodiment. Therefore, the equivalent resistance of the resistance control device 144 can be adjusted to match different operational modes and different operation frequencies of functional circuits 130 to provide the most suitable filtering frequency and minimize the mutual influences, such as high frequency spurs, between the other functional circuits 130 in the digital circuit 100.

Consequently, according to the digital circuit 100, the mutual influences between the functional circuits 130, such as the high frequency spurs and the sensitivity degradation, can be reduced according to different operational modes without adding extra circuits to the digital circuit 100.

Figure 3:
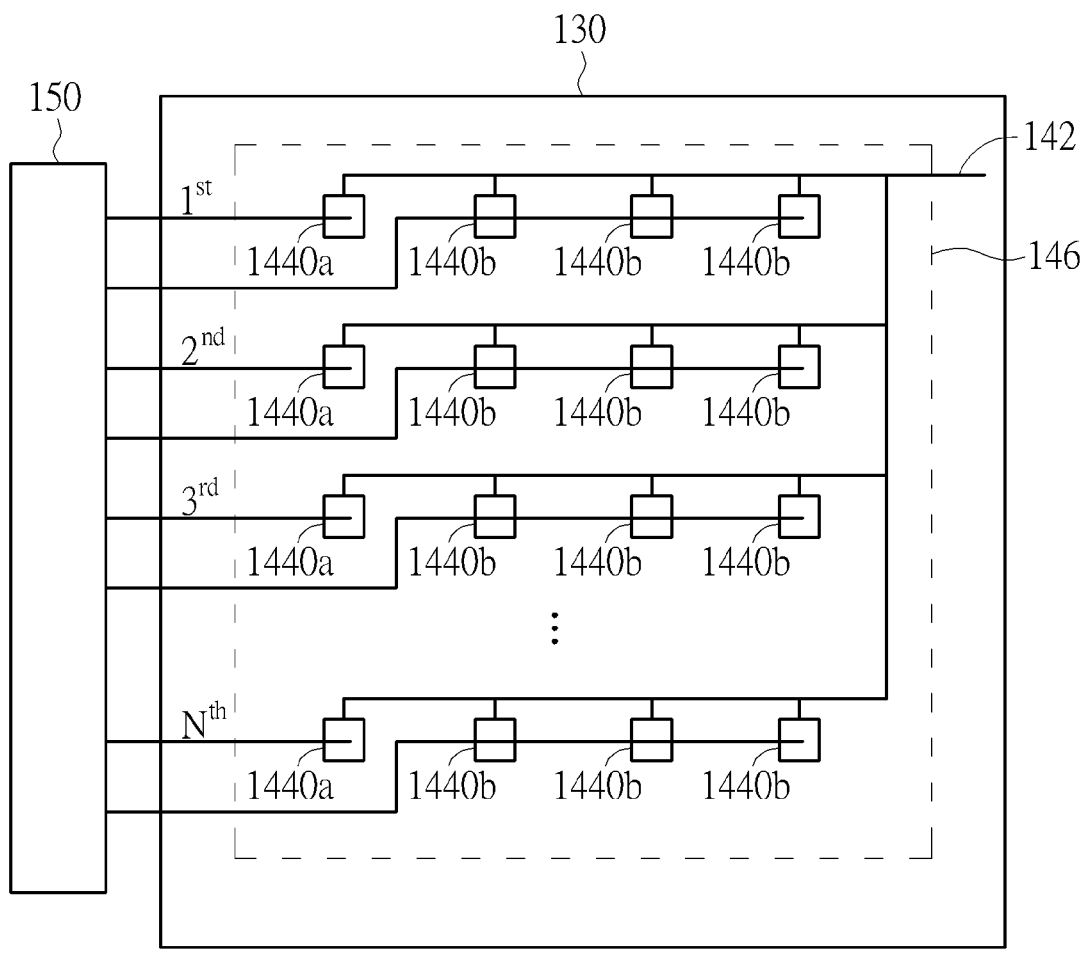
FIG. 3 shows a top view of a functional circuit of the digital circuit in FIG. 1 according to one embodiment of the present invention.

FIG. 3 shows the top view of the functional circuit 130 according to one embodiment of the present invention. The resistance control device 144 contains N rows of power switches 1440, wherein N is a positive integer. The N rows of power switches 1440 are evenly distributed within the digital macro 146. The finite state machine 150 can adjust the resistance of the resistance control device 144 by turning on or turning off n rows of power switches 1440, wherein n is a positive integer smaller than or equal to N. Furthermore, to ensure the power supply can be distributed through the digital macro 146 evenly, the finite state machine 150 can turn on or off the n rows of power switches 1440 that are evenly distributed among the N rows of power switches 1440. For example, if the finite state machine 150 is to turn on half of the power switches 1440, that is, to turn on N/2 of the N power switches 1440 in the functional circuit 130, the finite state machine 150 can turn on the $1^{st}$, the $3^{rd}$, ... and the $(N-1)^{th}$ row of the power switches 1440, where N is an even number larger than 4.

In addition, each row of power switches 1440 may comprise a physically smallest power switch 1440a. The finite state machine 150 can turn on the smallest power switch 1440a before turning on other power switches 1440b of the row so the rush current coming into the digital macro 146 can be reduced.

Furthermore, when the finite state machine turns off a selected number of power switches 1440, not only the equivalent resistance of the resistance control device 144 will increase, but also the voltage drop on the resistance control device 144 from the always-on power mesh 142 to the digital macro 146 may increase. A large voltage drop may cause the digital macro 146 work improperly. Therefore, to avoid the digital macro 146 from working improperly, the voltage level of the always-on power mesh 142 can be raised to a higher voltage level when the finite state machine 150 increases the resistance of the resistance control device 144 so the voltage drop on the resistance control device 144 can be compensated.

Figure 4:
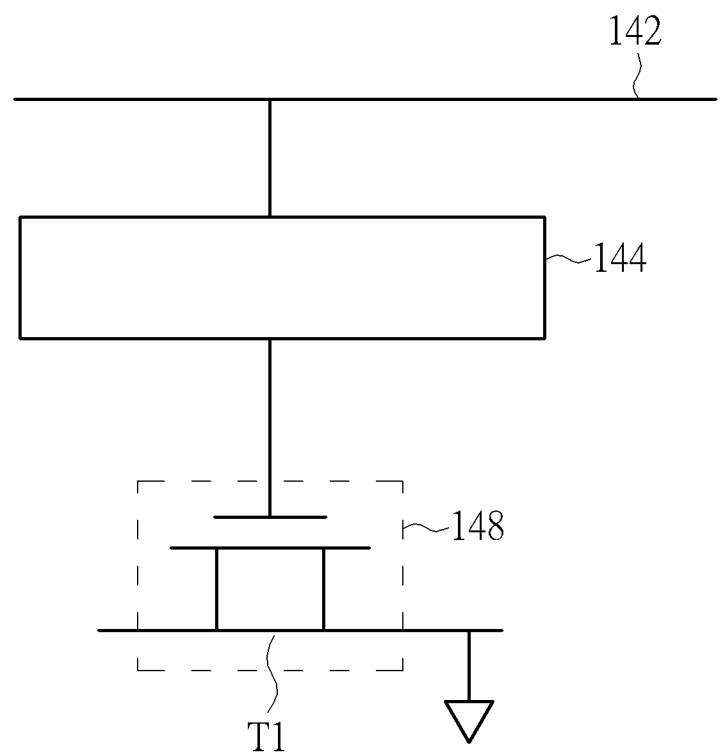
FIG. 4 shows a structure of a device with capacitance of the digital circuit in FIG. 1 according to one embodiment of the present invention.

In one embodiment, the device with capacitance 148 can be, but not limited to, the filler capacitor that is commonly used to fill the space of the integrated circuit. FIG. 4 shows the structure of the device with capacitance 148 according to one embodiment of the present invention. In FIG. 4, the device with capacitance 148 can be formed by a metal-oxide-semiconductor field effective transistor T1 (MOSFET). The gate of the MOSFET T1 is electrically connected to the resistance control device 144, the drain of the MOSFET T1 and the source of the MOSFET T1 are electrically connected to the ground. Since the resistance control device 144 are able to turn off the path between the MOSFET T1 and the always-on power mesh 142, the Electrostatic discharge (ESD) issue of the device with capacitance 148 can be avoided.

Consequently, the digital circuit of the embodiments according to the present invention can reduce the mutual influences between the functional circuits, such as the high frequency spurs and the sensitivity degradation, according to different operational modes and different frequencies of operations without adding extra circuits to the digital circuit.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A digital circuit comprising:
   a plurality of functional circuits, each functional circuit comprising:
      a digital hard macro coupled to a ground;

a resistance control device electrically connected between the digital hard macro and an always-on power mesh; and
at least one capacitor electrically connected between the resistance control device and the ground; and
a finite state machine electrically connected to the resistance control device and configured to adjust a resistance of the resistance control device.

2. The digital circuit of claim 1, wherein the resistance control device comprises a plurality of power switches and the finite state machine adjusts the resistance of the resistance control device by turning on or turning off a selected number of the power switches.

3. The digital circuit of claim 2, wherein the power switches contains N rows of power switches, wherein N is a positive integer.

4. The digital circuit of claim 3, wherein the finite state machine adjusts the resistance of the resistance control device by turning on or turning off n rows of power switches, wherein n is a positive integer smaller than or equal to N.

5. The digital circuit of claim 4, wherein the n rows of power switches are evenly distributed among the N rows of resistance control device.

6. The digital circuit of claim 3, wherein each row of the N rows of power switches comprises a smallest power switch.

7. The digital circuit of claim 6, wherein the finite state machine adjusts the resistance of the resistance control device by turning on the smallest power switch before turning on other power switches of the row.

8. The digital circuit of claim 1, wherein a voltage level of the always-on power mesh is raised to a higher voltage level when the finite state machine increases the resistance of the resistance control device.

9. The digital circuit of claim 1, wherein the capacitor is formed by a metal-oxide-semiconductor field effective transistor (MOSFET), wherein a gate of the MOSFET is electrically connected to the resistance control device, a drain of the MOSFET and a source of the MOSFET are electrically connected to the ground.

10. The digital circuit of claim 1, wherein the finite state machine is configured to adjust the resistance of the resistance control device according to at least a frequency of a leakage current, the leakage current being obtained by simulation under an operational mode of the digital hard macro.

11. The digital circuit of claim 1, wherein the digital hard macro is configured to process radio frequency (RF) signals and the finite state machine is configured to adjust the resistance of the resistance control device according to at least frequencies of the RF signals.

* * * * *